United States Patent

Wang et al.

[11] Patent Number: 5,982,551
[45] Date of Patent: Nov. 9, 1999

[54] OPTICAL ENCODER WHEEL WITH SPLIT LENS RING

[76] Inventors: Ching-Shun Wang, 2F,No.550,Min Tsu E.Rd, Taipei; Cheng-Liang Hsieh, 7F,No.142-1,Lane 108,Sec.1,Kuang Fu Rd., E.Dist., Hsin Chu, both of Taiwan

[21] Appl. No.: 09/160,096

[22] Filed: Sep. 25, 1998

[51] Int. Cl.[6] .............................. G02B 27/10; G02B 3/00
[52] U.S. Cl. ...................... 359/619; 359/642; 359/738; 359/809
[58] Field of Search .................................. 250/215, 221, 250/231.13–231.18, 559.12; 345/163, 166, 167; 396/85, 87; 359/234, 235, 642, 619, 738, 620, 809, 813, 821

[56] References Cited

U.S. PATENT DOCUMENTS

| | | |
|---|---|---|
| 4,757,196 | 7/1988 | Yamada et al. .................. 250/231 SE |
| 4,899,048 | 2/1990 | Shelander .......................... 250/231 SE |
| 5,148,020 | 9/1992 | Machida ............................. 250/231.14 |
| 5,241,172 | 8/1993 | Lugaresi ............................. 250/231.14 |

Primary Examiner—Georgia Epps
Assistant Examiner—David N. Spector
Attorney, Agent, or Firm—Rosenberg, Klein & Bilker

[57] ABSTRACT

Disclosed is a split-lens for grating wheel comprising a disk body and a ring-lens around the peripheral of the disk body wherein said ring-lens comprises alternately-arranged opaque parts and transparent parts, and transparent parts forms the convex lens portion for said ring-lens. The opaque parts are arranged in radial direction on peripheral of the disk body and with equi-angle. By this configuration, the inference problem can be solved and the resolution can be enhanced.

10 Claims, 18 Drawing Sheets

OPTICAL ENCODER WHEEL WITH SPLIT LENS RING

FIELD OF THE INVENTION

The present invention relates to a split-lens type grating wheel for optical encoder, more particularly, to a split-lens type grating wheel which has a plurality of equi-angle convex lens on peripheral thereof and can enhance the resolution of optical encoder, thus preventing malfunction of the encoder.

BACKGROUND OF THE INVENTION

As the prevalence of multimedia and window OS system, the mouse and track ball become essential devices for computer for pointing and sending command. Taking mouse as an example, the mouse is handled on a mouse pad with slight friction and the movement of mouse will cause a corresponding movement of cursor in screen. The corresponding movement of cursor by moving a mouse is achieved by an optical encoder. FIG. 12 shows the internal view of a mouse. A circuit board 81 is placed in front of the mouse body 80 and has three micro-switches corresponding to left, central right button on case of mouse.

The circuit board 81 has an optical encoder 90 on rear side thereof which comprises an X-axis encoder 91 and a Y-axis encoder 92. Each X/Y-axis encoder has a grating wheel 910/920 and an optoelectronic element 93/94. One end of the shaft of the grating wheel is in contact with the surface of the ball 95 such that the grating wheel 910, 920 will rotate in response to the rolling of ball 95.

As shown in FIG. 13, taking the Y-axis encoder as an example, the optical element 94 including a light source 941 and a light receiver 942 is arranged opposite to the slit of the grating wheel 920. The slit will shield intermittently the light from the light source 941 when the grating wheel rotates. The light receiving ends PT1 and PT2 of the light receiver 942 are functioned to determine the rotation direction of the grating wheel 920 by receiving the intermittent light.

As shown in FIG. 14, the relative movement of the grating wheel 920, the light source 941 and the light receiver 942. in FIG. 14A, the two light receiving ends PT1, PT2 of the light receiver 942 is blocked by the grating wheel the digital counter part is shown in T1 of FIG. 15 wherein PT1 and PT2 are (0,0). As the grating wheel 920 rotating, the PT2 receives light from slit 920A while the PT1 is still blocked, therefore, in period T2, (PT1,PT2) is (0,1). As the grating wheel 920 still rotating, both PT1 and PT2 receive light from slit 920A, as shown in FIG. 14C. Therefore, in period T3 of FIG. 15, (PT1,PT2) is (1,1). As the grating wheel 920 still rotating, PT1 receives light from slit 920A, while PT2 is blocked by slit 920A, as shown in FIG. 14D. Therefore, in period T4 of FIG. 15, (PT1,PT2) is (1,0).

However, the working waveform shown in FIG. 15 will be influenced by the light interference. This phenomenon can be more clearly explained with reference to FIG. 16 where D denotes light source, C denotes the grating wheel in front of the light source D, C1 and C2 denote the slits on grating wheel C, and S denotes the sensor opposite to light source D and moving up and down along T-axis.

FIG. 17 shows the wave distribution of light passing through slits C1 and C2, wherein N is the intensity and H is the field distribution.

When slit C2 is blocked, the waveform detected by sensor S is $N1=(H1)^2$.

When slit C1 is blocked, the waveform detected by sensor S in $N2=(H1)^2$.

If the light from slit C1 and C2 do not interfere with each other, the waveform detected by sensor S is N12=N1+N2, as shown in FIG. 18.

However, due to the interference, the really waveform is N12–N1+N2, as shown in FIG. 19.

The interference of light will influence the resolution of PT1 and PT2. Again taking a glance at FIG. 14A, the detection signal on PT1 and PT2 is desirable to be (0,0) when PT1 and PT2 are blocked by the opaque part between slits. However, the PT1 and PT2 may be erroneously detected to receive light caused by the light interference.

There are two methods to prevent the problem caused by light interference.

1. Minimize the distance between the light receiver and the grating wheel. However, the manufacturing technique is different.
2. Increase the size of the slit to be three times of light receiving end of the light receiver. However; the resolution is degraded.

As mentioned above, the prevention of light interference is at the expense of ost and resolution, there is still much to be improved.

SUMMARY OF THE PRESENT INVENTION

It is an object of the present invention to provide a split lens-type grating wheel to overcome the problem of light interference and maintain resolution.

To achieve the above object the inventive grating wheel comprise a disk body and a ring-lens around the peripheral of the disk body wherein the lens comprises alternating opaque part and transparent part.

The opaque parts are arranged in radial direction with the shaft of the disk as center. The transparent parts are lens-structure and arranged with equal angular span, such that the incident light is focused by the transparent part.

The opaque parts can be formed by coating, plating, printing or attaching.

The opaque part can be formed on the front side or back side of the lens.

The lens portion can be integrally formed on the peripheral of the disk body, or can be manufactured separately.

The various objects and advantages of the present invention will be more readily understood from the following detailed description when read in conjunction with the appended drawing, in which:

| Numerals | | | |
|---|---|---|---|
| 10 | disk | 41, 42 | light receiving end |
| 12 | shaft | 81 | circuit board |
| 21 | opaque part | 90 | optical encoder |
| 30 | light source | 92 | Y-axis encoder |
| 11 | axial hole | 920A | slit |
| 20 | lens | 941 | light source |
| 22 | transparent part | 95 | ball |
| 40 | light receiver | D | light source |
| 80 | mouse body | C | grating wheel |
| 82 | micro-switch | | |
| 91 | X-axis encoder | | |
| 910, 920 | grating wheel | | |
| 93, 94 | optoelectronic element | | |
| 942 | light receiver | | |
| PT1, PT2 | light receiving end | | |
| S | sensor | | |
| C1, C2 | slit | | |

DETAIL DESCRIPTION OF PREFERRED EMBODIMENT

Figure 1:
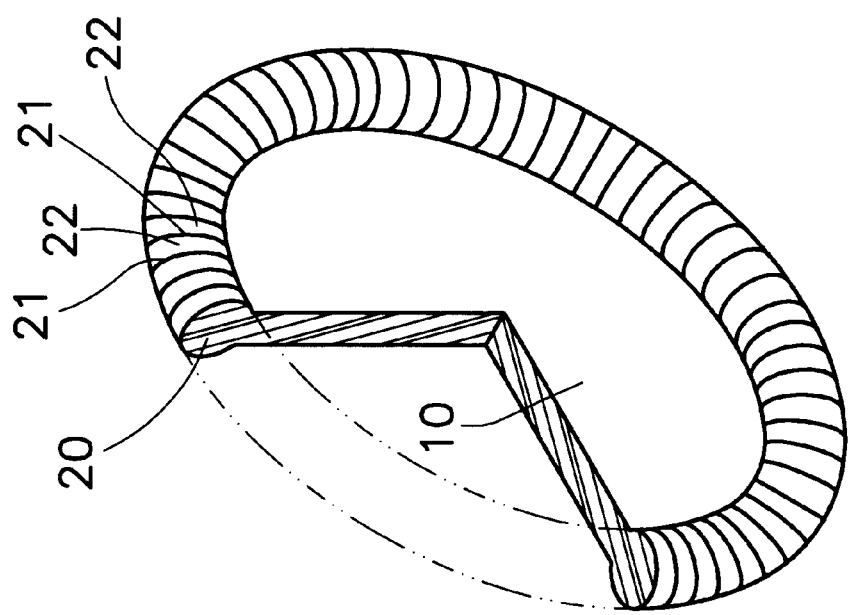
FIG. 1 shows the perspective view of the invention.
Figure 2:
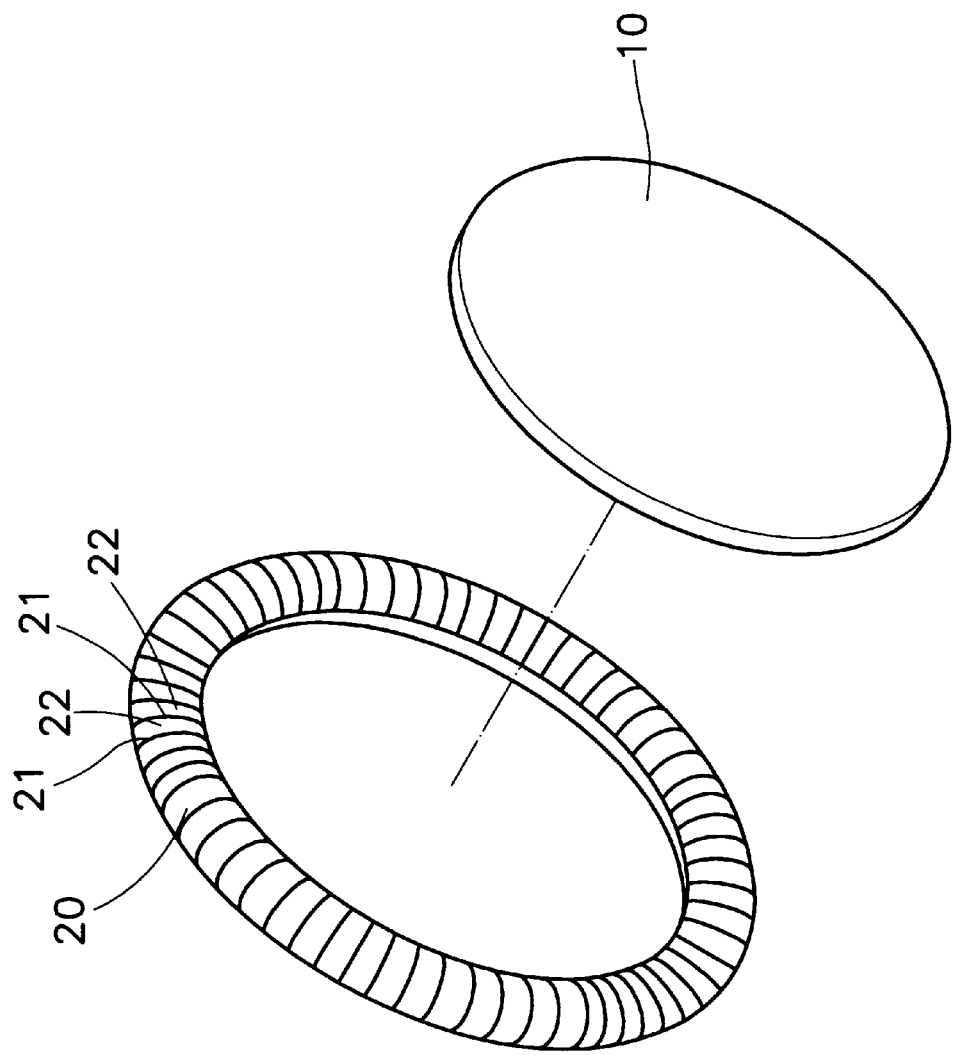
FIG. 2 shows the disk and the lens portion in a separated state.

FIG. 1 shows the grating wheel of the invention. The inventive grating wheel comprises a disk 10, and a ring-shaped lens 20 arranged around the rim of the disk 10, wherein the lens 20 is formed integrally with the disk 10. Besides, as shown in FIG. 2, the lens 20 and the disk 10 can be manufactured separately and then the disk 10 is inserted into the inner space of the lens 20 and fixed by glue, embedding force . . . etc.

Again with reference to FIG. 1, the disk 10 and the lens 20 are made of transparent material. The lens 20 is of ring-shape and has suitable curvature on front and back surface thereof.

The front surface and back surface, or one of these surface of the lens 20 are provided with a plurality of opaque part 21 formed by printing plating pasting or attaching.

Figure 3C:
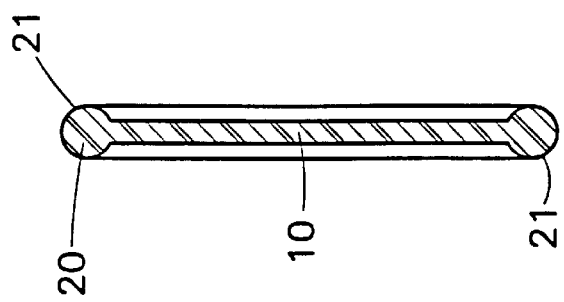
FIGS. 3A–C show the opaque part formed on the front, back surface or one of those surface.
Figure 3B:
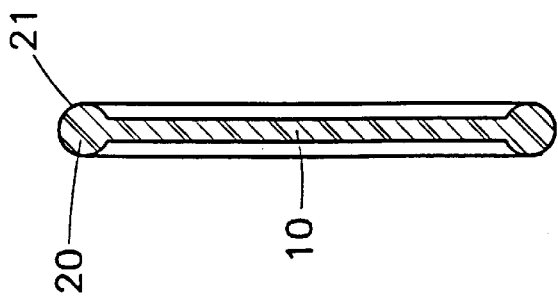
Figure 3A:
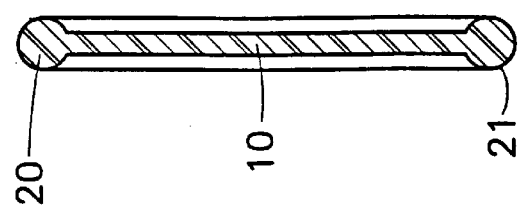

FIGS. 3A–C show the formation position of the opaque part 21. As shown in FIGS. 3A–C, the opaque part 21 is formed on the front side, back side or both sides of the lens 20, and the opaque part 21 extends to the curved surface of the lens 20 for blocking light.

Figure 4:
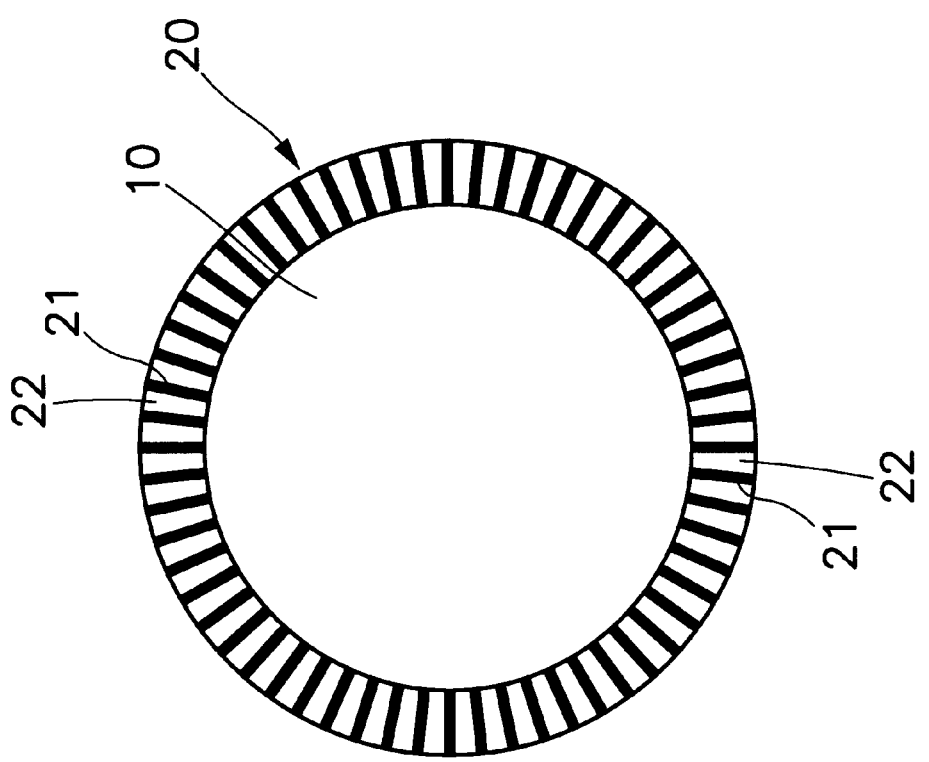
FIG. 4 shows the distribution of the opaque portion.

As shown in FIG. 4, the opaque pails 21 of the lens 20 are distributed radially with equal angular span, and centered at the shaft. Moreover, the transparent part 22 is formed between two opaque part 21.

More particularly, the opaque part 21 and the transparent part 22 are alternatively arranged such that each transparent part 22 forms an independent lens for focusing light.

Figure 5:
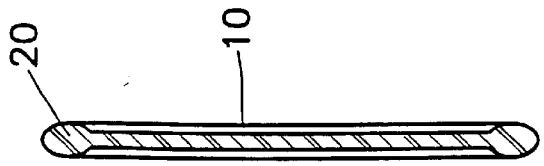
FIG. 5 shows the lens with different curvatures.

As shown in FIG. 5 the cross-section of the lens 20 is like a football shape and has radius of curvature R1 and R2 on each side. The focal length F of the lens 20 is determined by following formula:

$$1/F=(1/R1+1/R2)N-1$$

where N is the refractive index of the lens.

Figure 6:
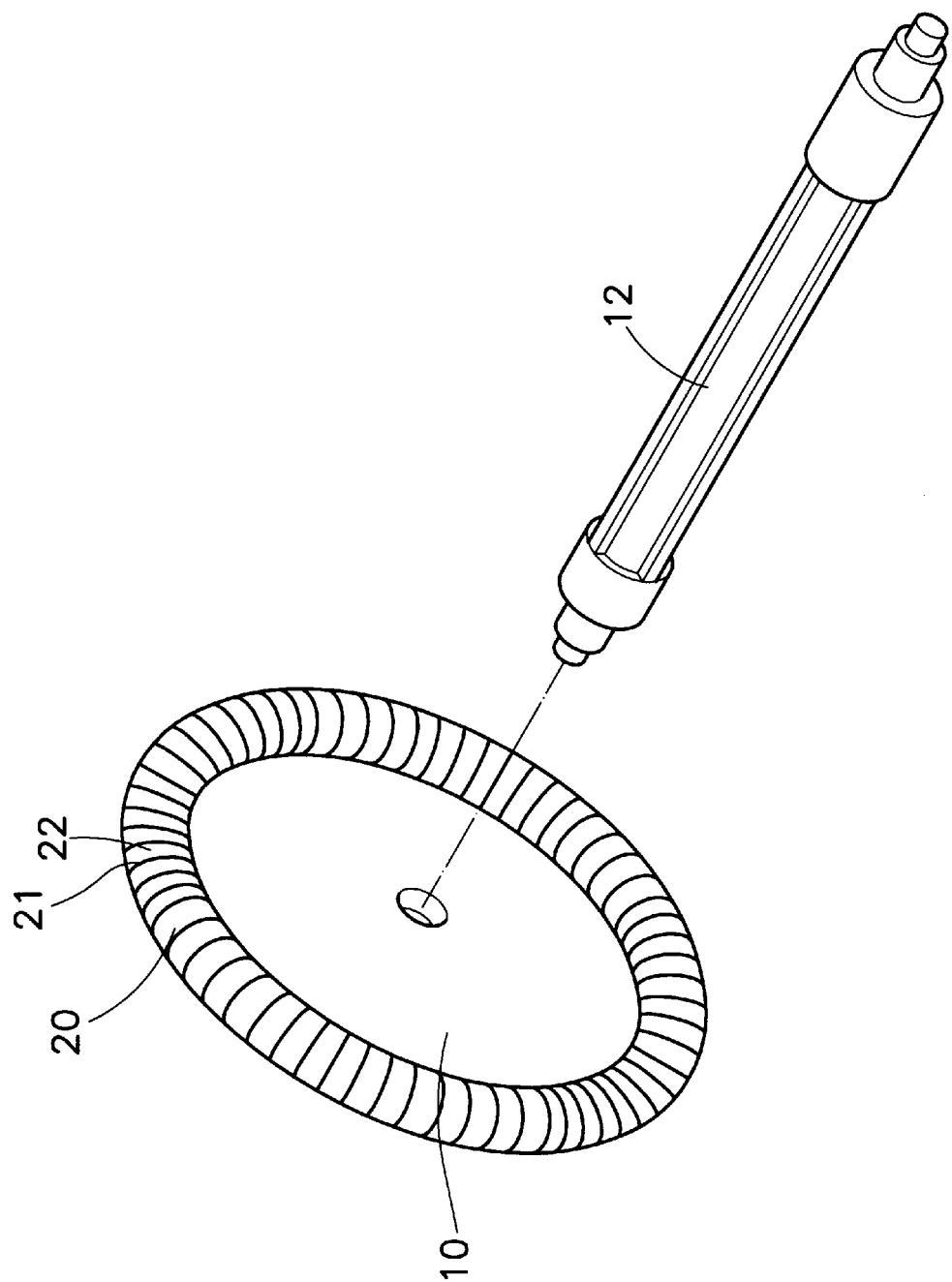
FIG. 6 shows one combination method of the grating wheel and the shaft in the invention.
Figure 7:
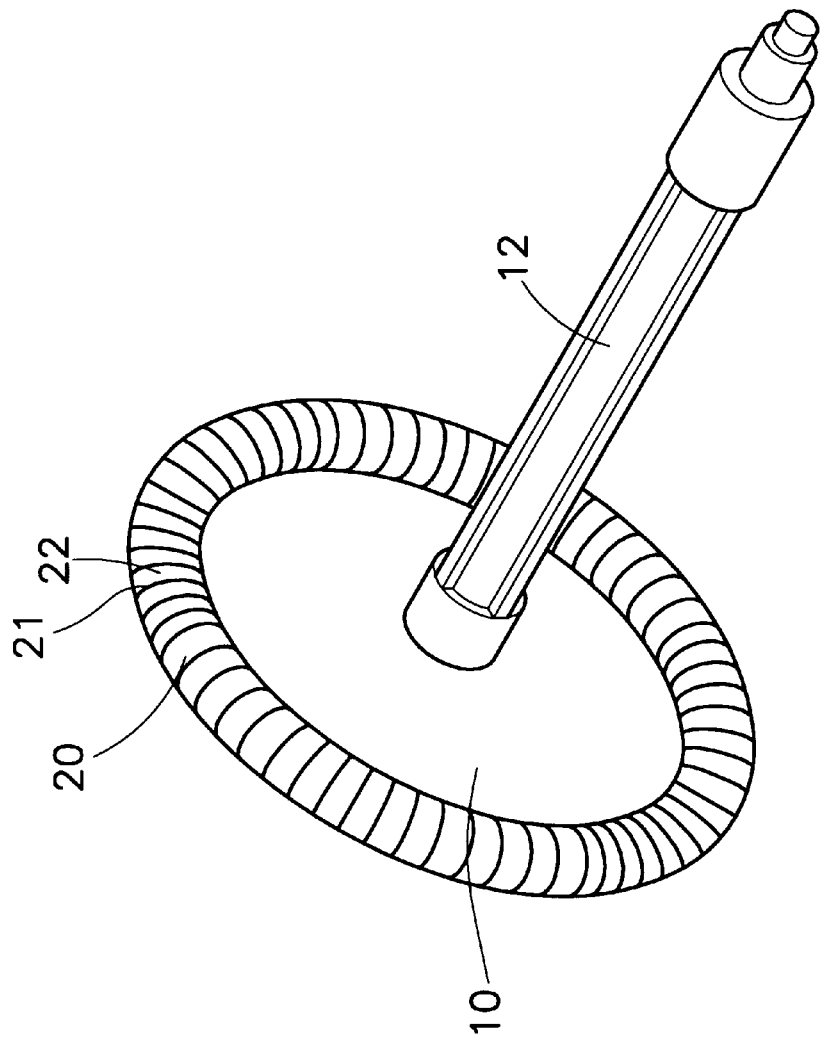
FIG. 7 shows another combination method of the grating wheel and the shaft in the invention.

The grating wheel can be provided with shaft on center thereof in different ways. As shown in FIG. 6, an axial hole 11 is formed on center of the disk 10 for the insertion of an independently formed shaft 12. As shown in FIG. 7, the shaft 12 is integral with the disk 10.

The effect and function of the inventive grating wheel are described below.

Figure 8:
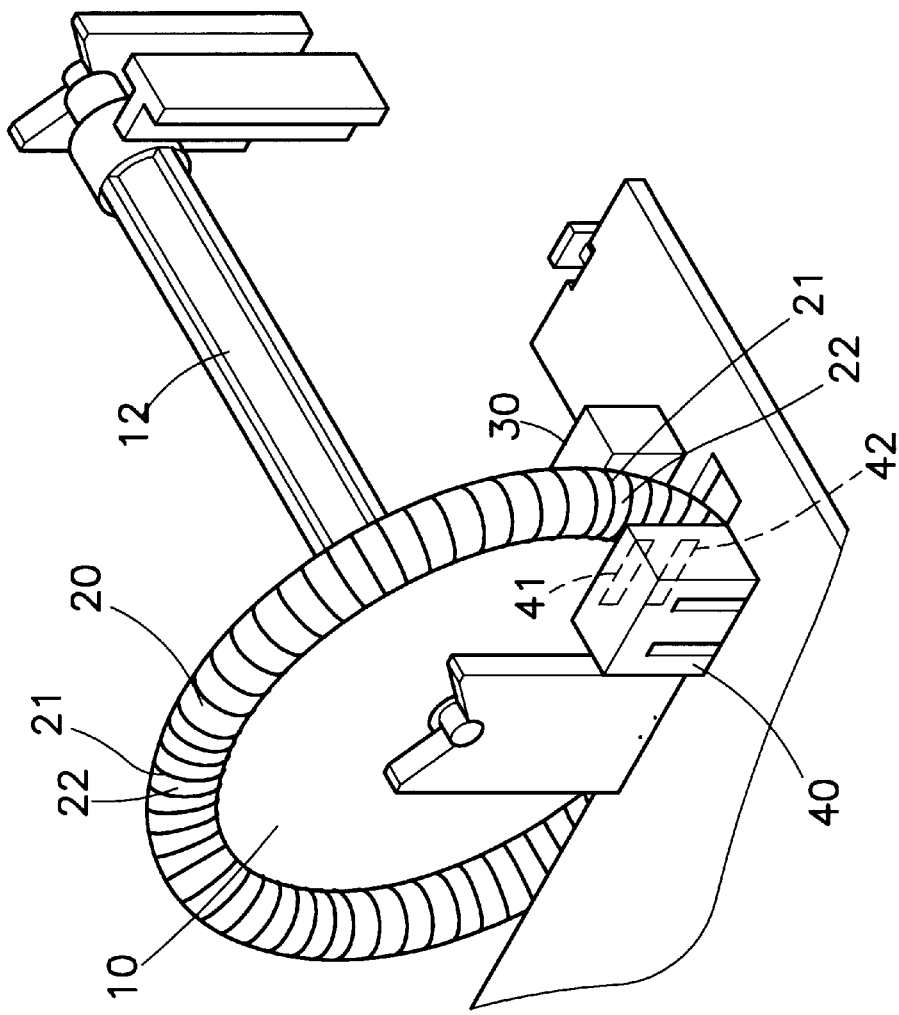
FIG. 8 shows the relative position between the grating wheel and the opto-electronic element.

The inventive grating wheel, as the conventional one, is arranged between the light source and the light receiver. As shown in FIG. 8, the disk 10 is pivotally arranged through the shaft 12, and the lens 20 around the disk 10 are arranged between the light source 30 and the light receiver 40. Two light receiving ends 41 and 42 are provided on the light receiver 40 to receive the light from the light source 30 and passing through the transparent part 22.

Figure 9B:
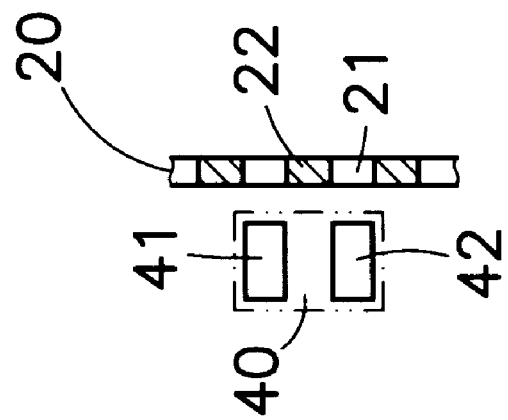
FIG. 9 shows the arrangement of the grating wheel and the light receiver in the invention.
Figure 9A:
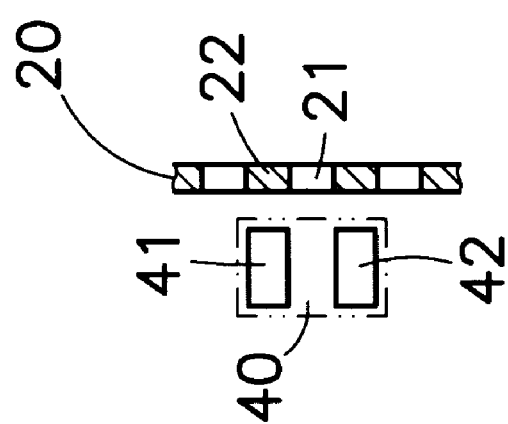

As shown in FIG. 9A, the two light receiving parts 41 and 42 arc placed initially right behind two transparent parts 22 by properly rotating the grating wheel.

Afterward, as shown in FIG. 9B, by rotating again the grating wheel, the ends 41 and 42 are placed behind the opaque part 21. In this case, the clear signal (0,0) can be obtained at the ends 41 and 42 because the light passing through the transparent part 22 will be focused to places dodging the receiving ends 41 and 42, thus preventing the malfunction.

Figure 10:
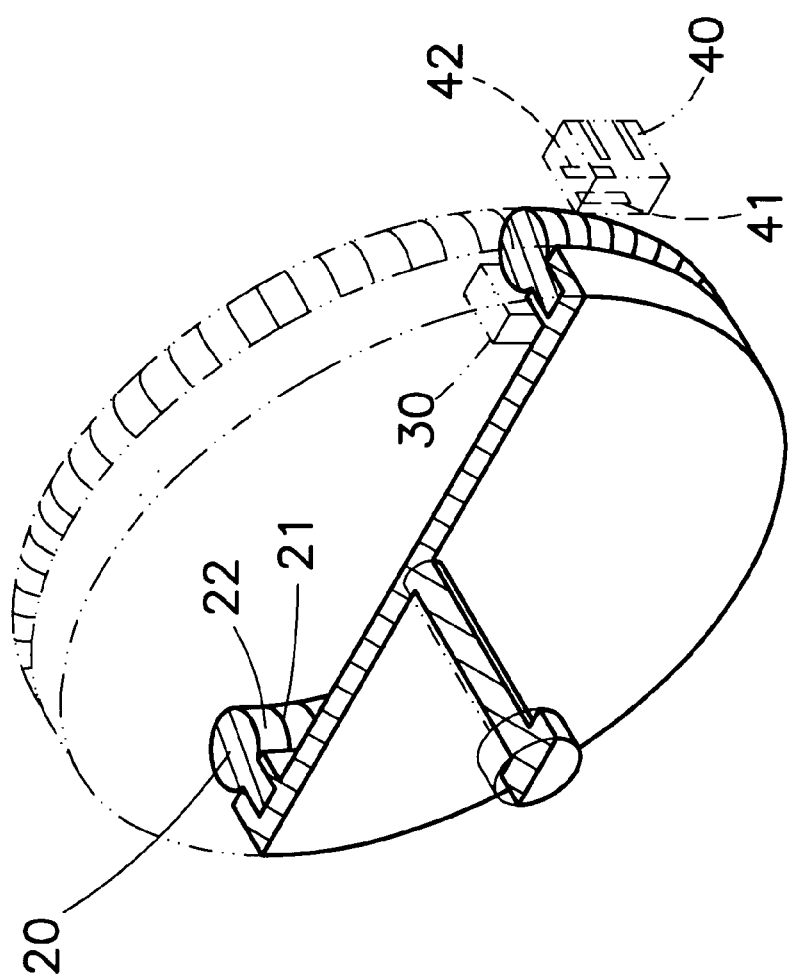
FIG. 10 shows another combination method of the grating wheel and the shaft in the invention.
Figure 11:
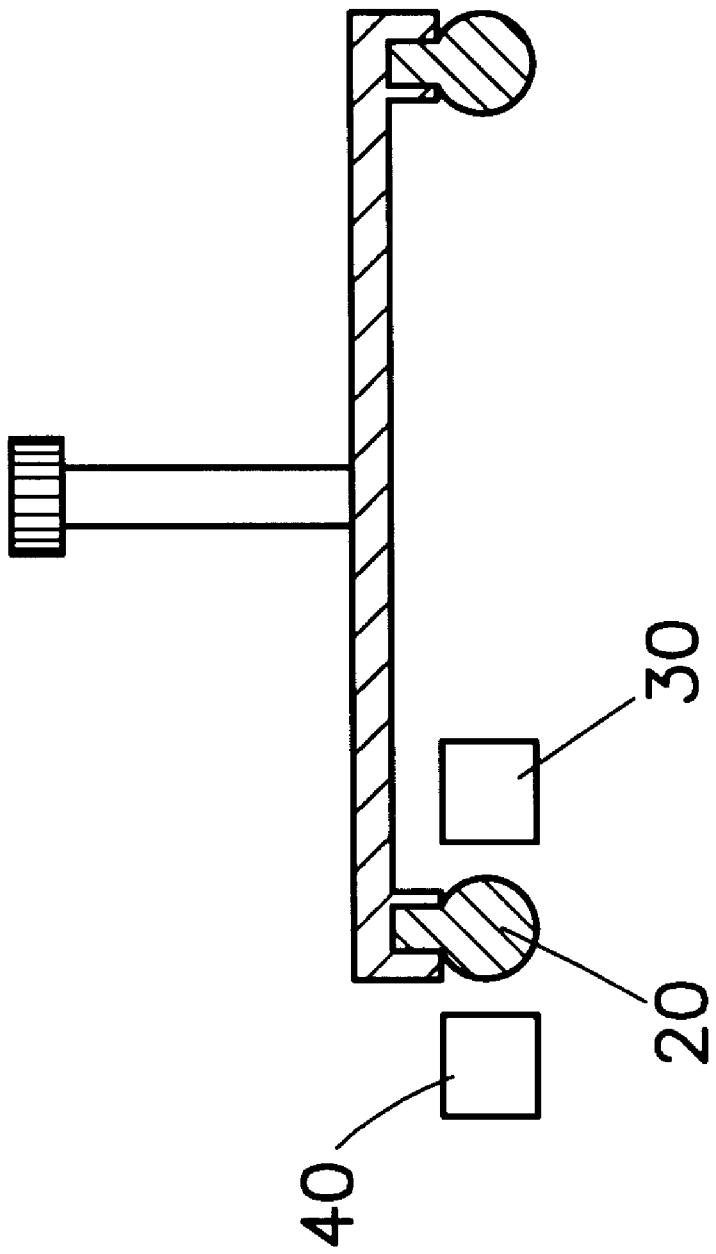
FIG. 11 shows still another combination method of the grating wheel and the shaft in the invention.
Figure 12:
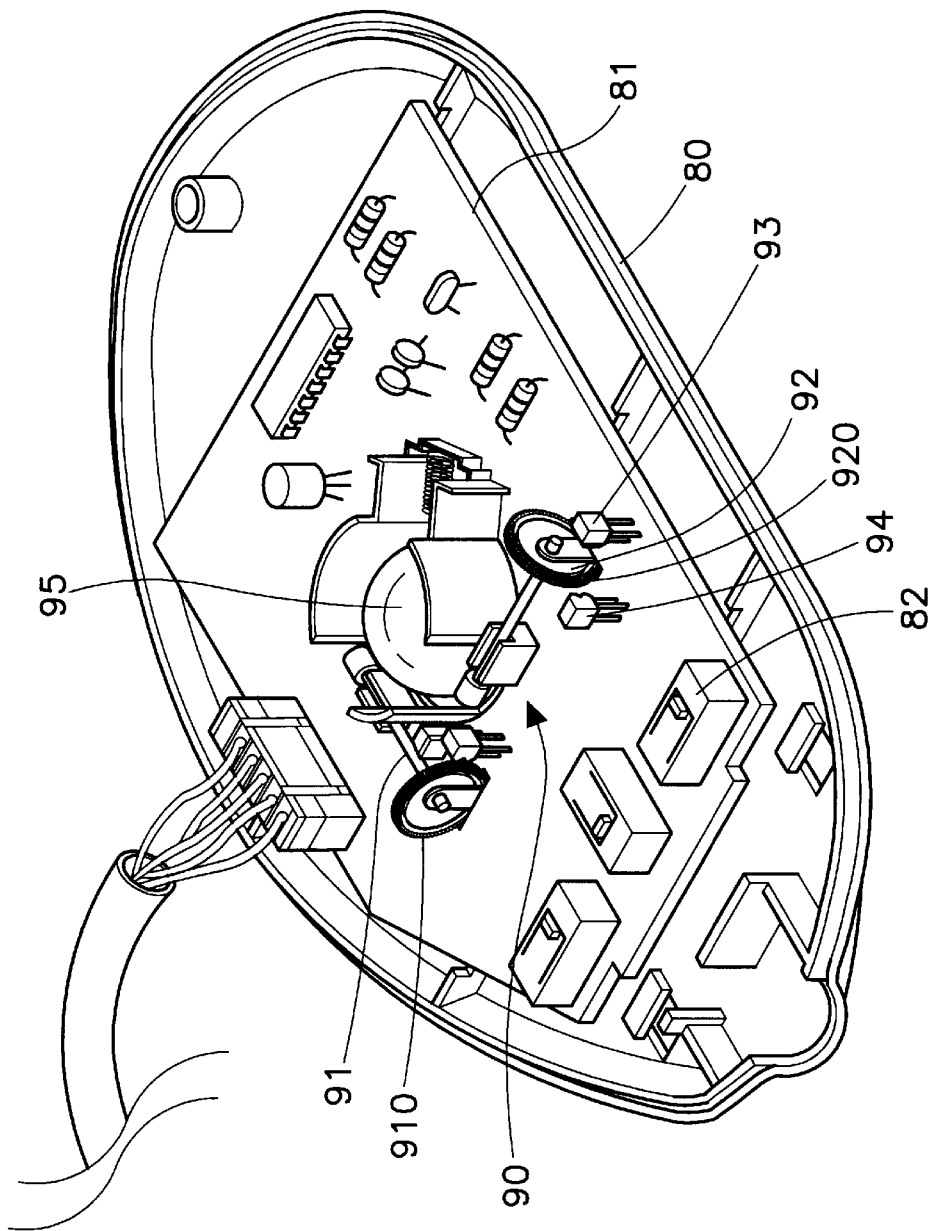
FIG. 12 shows still the internal structure of a conventional mouse.
Figure 13:
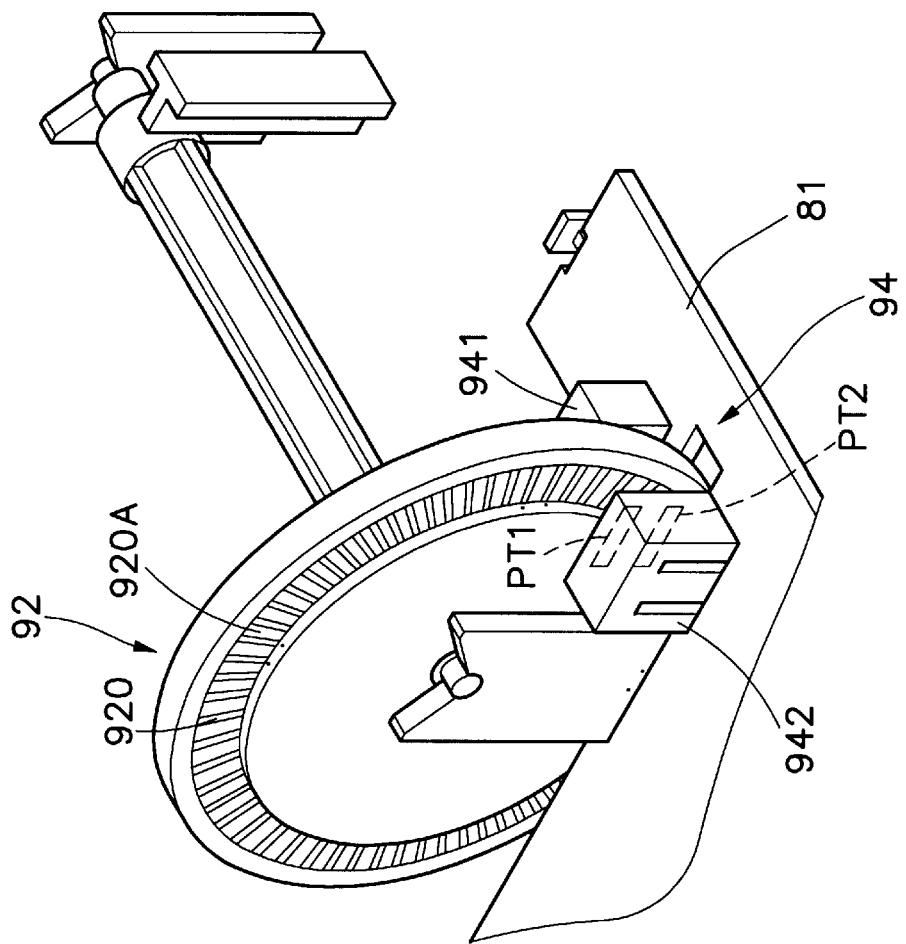
FIG. 13 shows partial view of the conventional optical encoder.
Figure 14D:
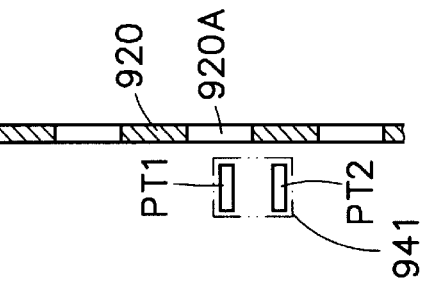
FIGS. 14A–C show the arrangement of conventional grating wheel and light receiver.
Figure 14C:
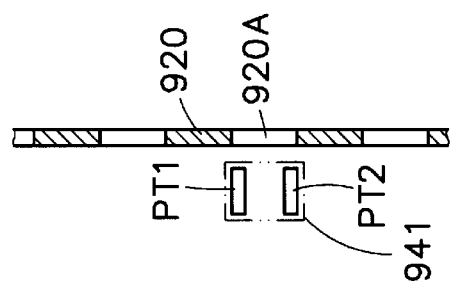
Figure 14B:
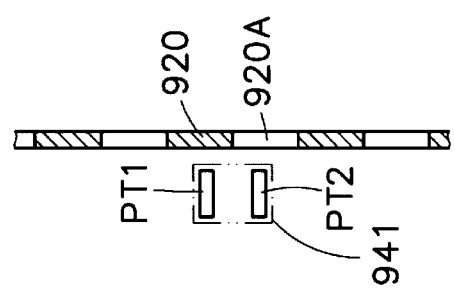
Figure 14A:
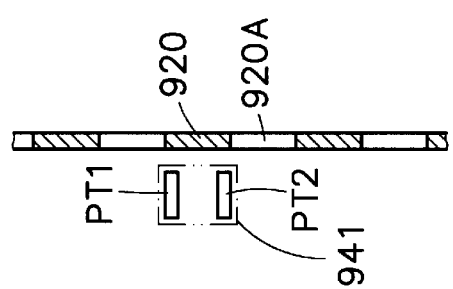
Figure 15:
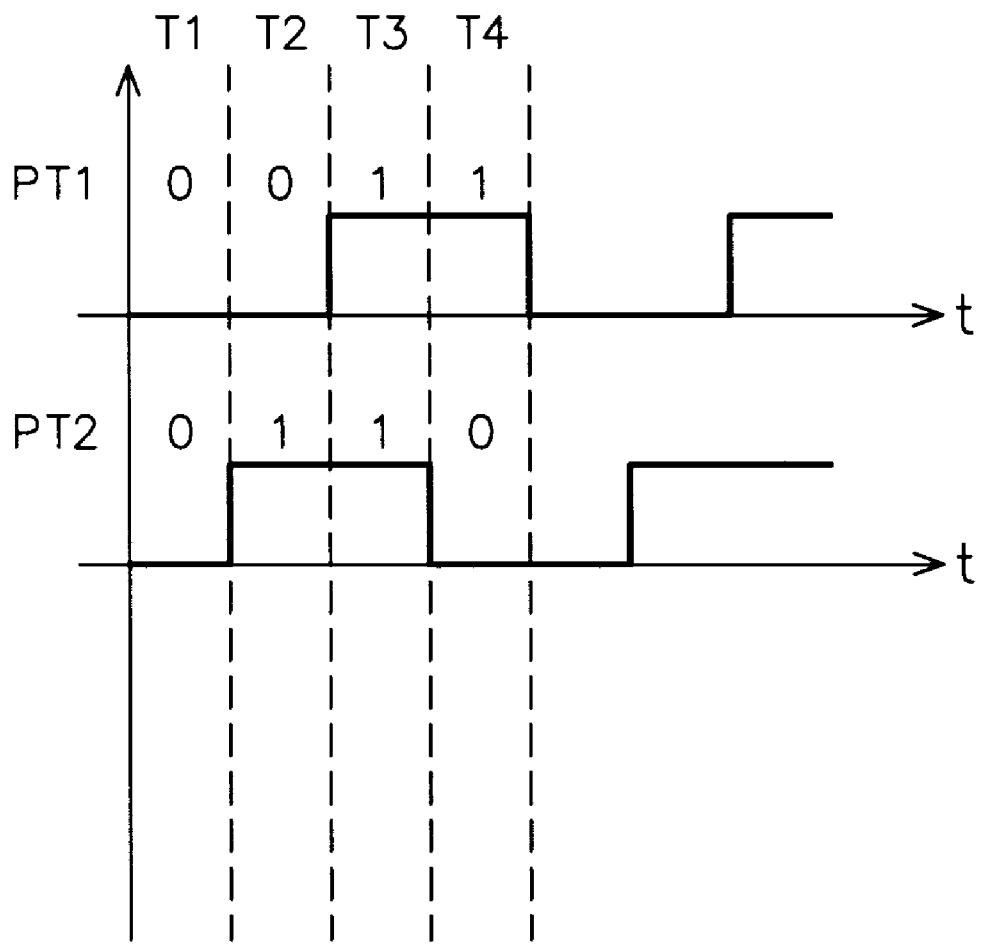
FIG. 15 shows the waveform detected by a light receiver for a conventional grating wheel.
Figure 16:
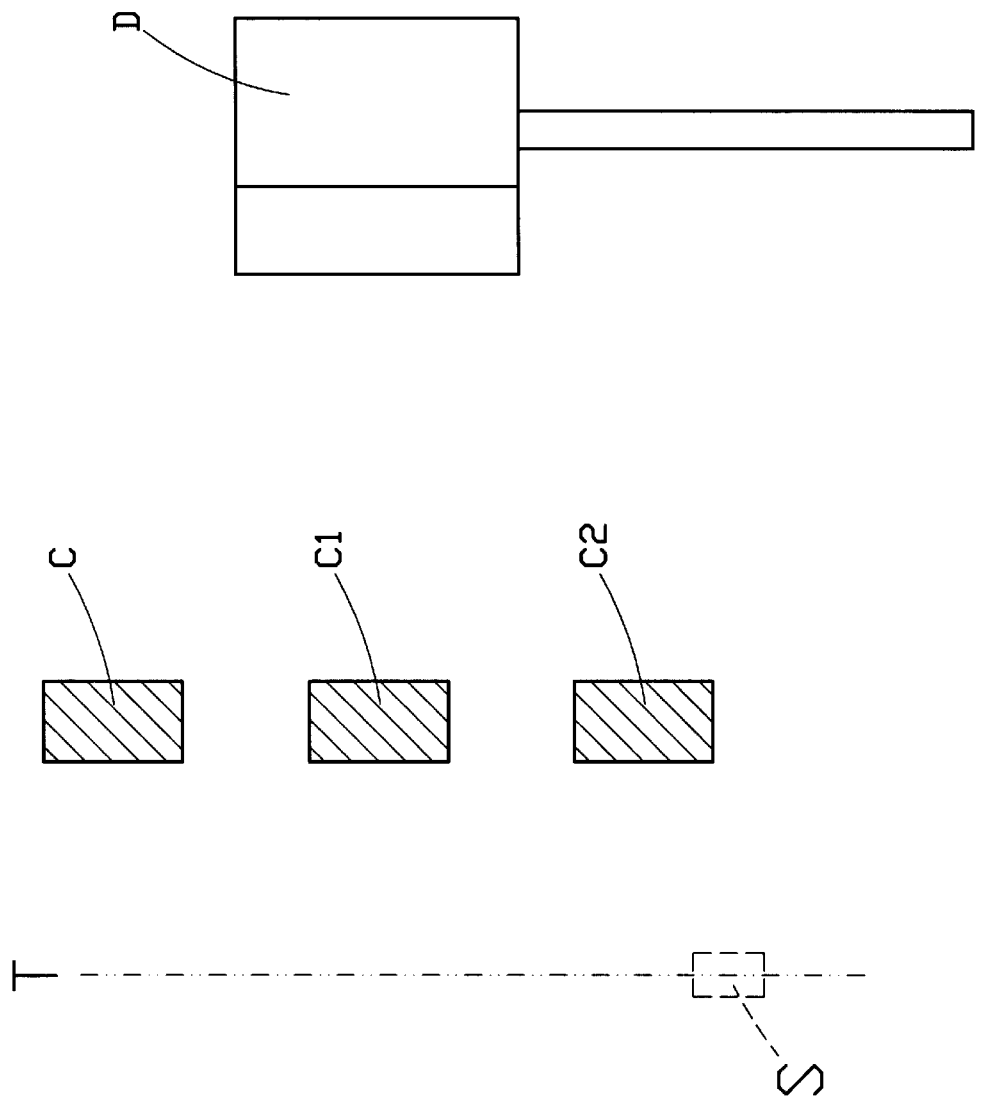
FIG. 16 shows the testing configuration of conventional optical encoder.
Figure 17:
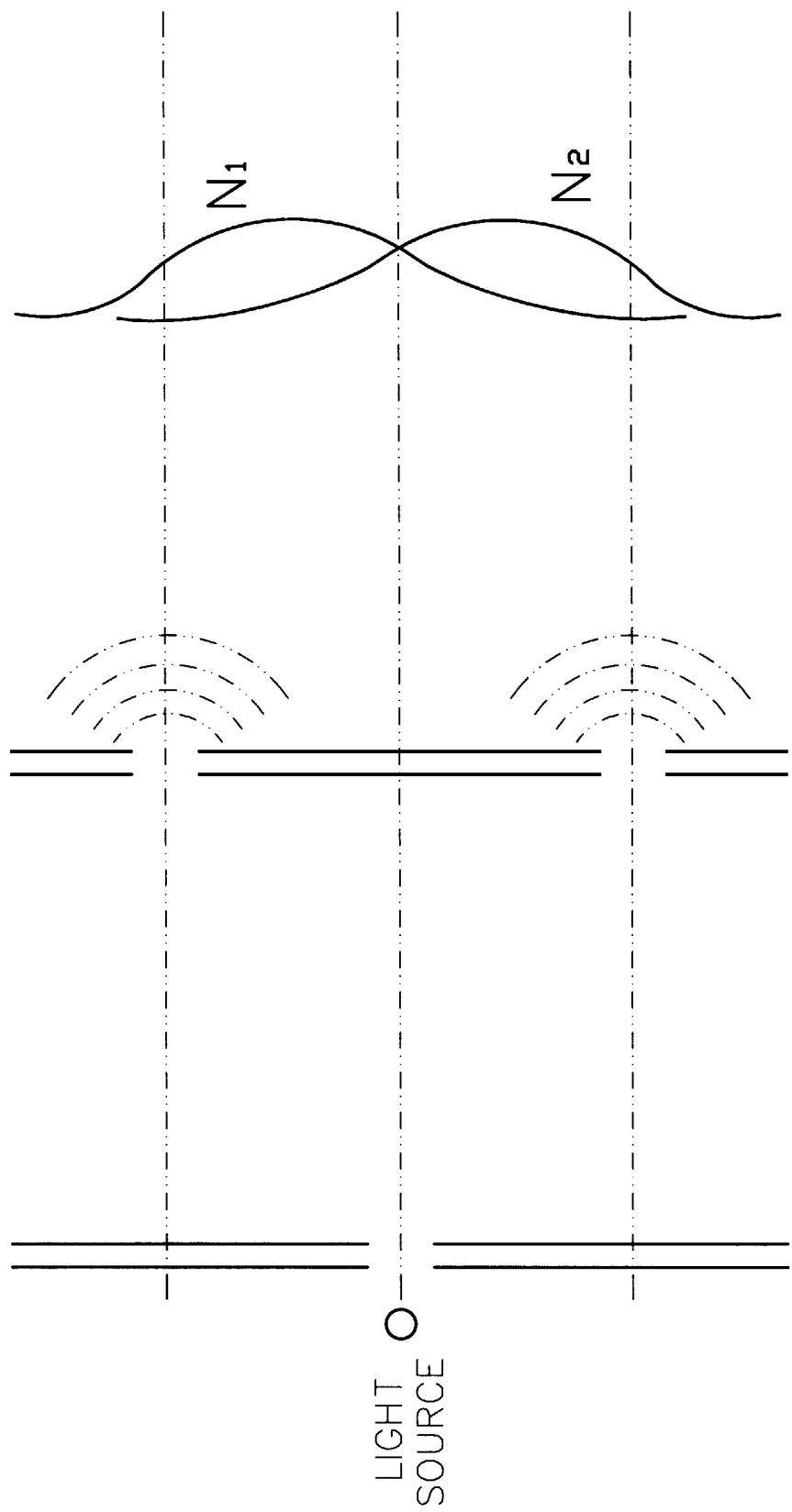
FIGS. 17–19 shows the waveform in the test of conventional optical encoder.
Figure 18:
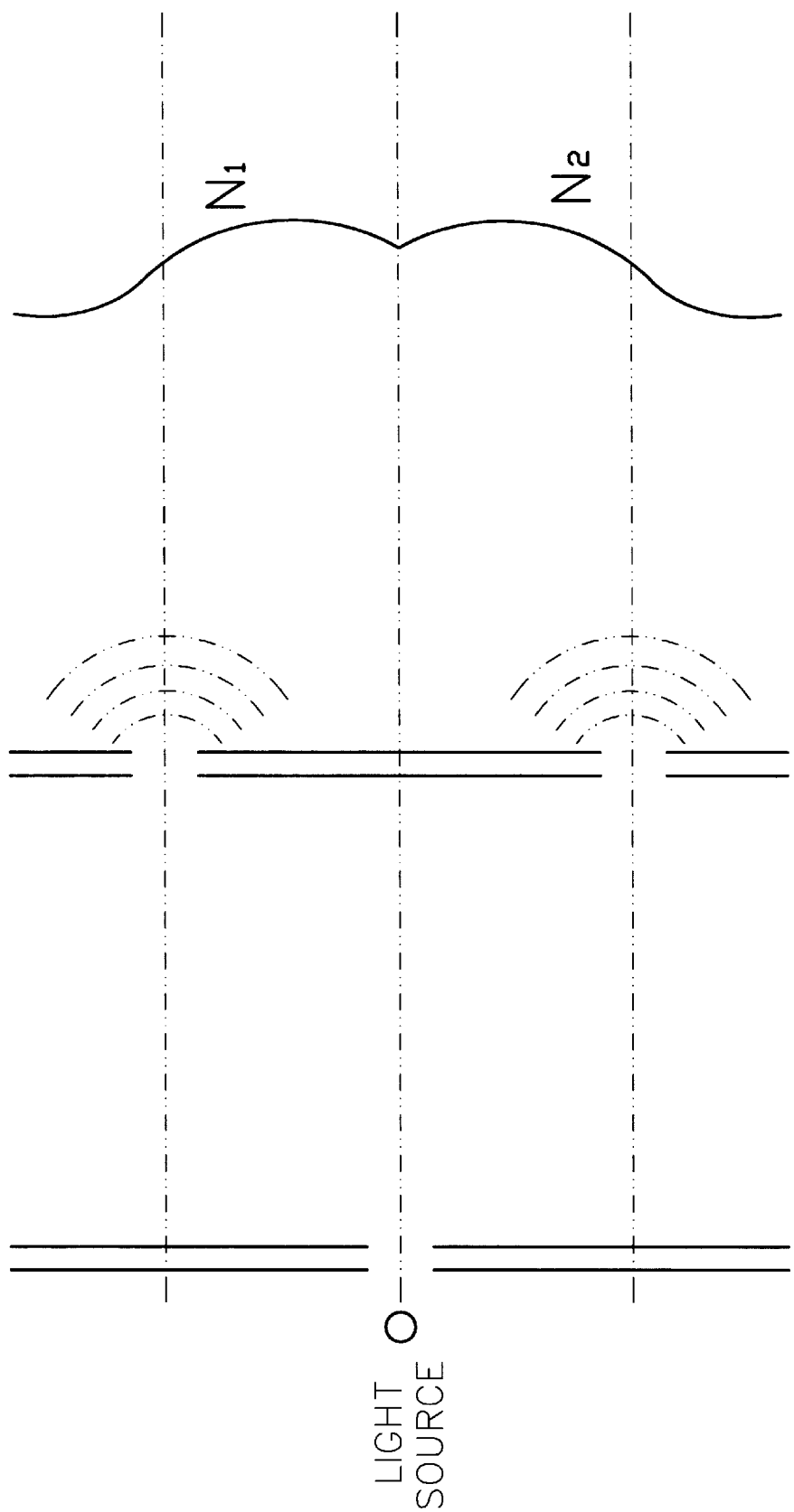
Figure 19:
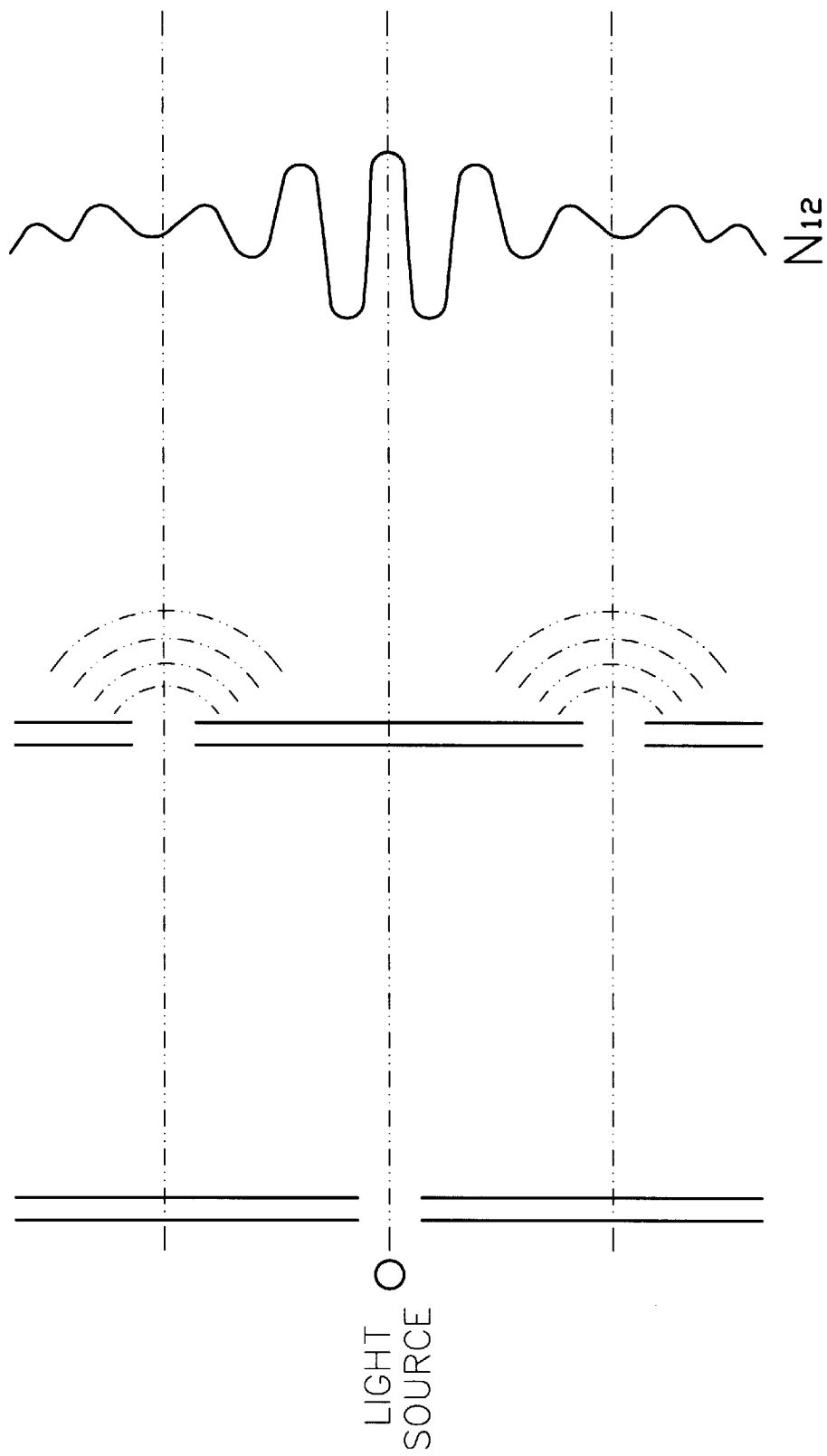

FIGS. 10 and 11 show the perspective view and cross-sectional view of the invention wherein the grating wheel and the shaft has different combination method. The ring-shaped lens 20 is embedded into the rim of a disk 10 with T-shape cross-section. The lens 20 is placed between the light source 30 and the light receiver 40. Two light receiving ends 41 and 42 are provided on the light receiver 40 to receive light from the light source 30.

To sum up, the inventive grating wheel has following advantages.

1. The malfunction can be prevented: the inventive grating wheel has ring-shape lens around the disk thereof and the lens has alternative opaque part and transparent part wherein the transparent part is functioned as split-lens to focus light and eliminate interference.

2. The resolution is enhanced: Because of the above-mentioned focusing effect provided by the transparent part, the pitch of the transparent/opaque parts can be decreased, thus enhancing resolution.

3. Easy manufacture: The solution provided by the present invention is easy to implement thus reducing cost.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

We claim:

1. A split-lens for grating wheel comprising a disk body and a ring-lens around the peripheral of the disk body wherein said ring-lens comprises alternately-arranged opaque parts and transparent parts, said transparent parts forming the convex lens portion for said ring-lens.

2. The split-lens for grating wheel as in claim 1, wherein said opaque parts are arranged in radial direction on peripheral of the disk body and with equi-angle.

3. The split-lens for grating wheel as in claim 1, wherein said opaque parts can be formed by coating, plating, printing or attaching.

4. The split-lens for grating wheel as in claim 1, 2 or 3 wherein said opaque parts are simultaneously formed on the front and rear side of said ring-lens.

5. The split-lens for grating wheel as in claim 1, 2 or 3 wherein said opaque parts are simultaneously formed on the front side of said ring-lens.

6. The split-lens for grating wheel as in claim 1, 2 or 3 wherein said opaque parts are simultaneously formed on the rear side of said ring-lens.

7. The split-lens for grating wheel as in claim 1 wherein said ring-lens is formed integrally with said disk body.

8. The split-lens for grating wheel as in claim 1 wherein said ring-lens is formed separately with said disk body, and then assembled with said disk body.

9. The split-lens for grating wheel as in claim 1 or 8 wherein said disk body has an axial hole at center thereof and has a shaft arranged within said axial hole.

10. The split-lens for grating wheel as in claim 1, 8 or 9 wherein said disk body has a shaft formed integrally therewith on center location thereof.

\* \* \* \* \*